United States Patent
Susai et al.

(10) Patent No.: US 12,068,359 B2
(45) Date of Patent: Aug. 20, 2024

(54) SEMICONDUCTOR DEVICES AND METHODS OF FABRICATING A SEMICONDUCTOR DEVICE

(71) Applicant: GLOBALFOUNDRIES Singapore Pte. Ltd., Singapore (SG)

(72) Inventors: Lawrence Selvaraj Susai, Singapore (SG); Chor Shu Cheng, Singapore (SG); Yong Chau Ng, Singapore (SG); Lulu Peng, Singapore (SG); Zishan Ali Syed Mohammed, Singapore (SG); Nuraziz Yosokumoro, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 745 days.

(21) Appl. No.: 16/601,632

(22) Filed: Oct. 15, 2019

(65) Prior Publication Data

US 2021/0111243 A1 Apr. 15, 2021

(51) Int. Cl.
*H01L 49/02* (2006.01)
*H01L 23/31* (2006.01)
*H01L 23/64* (2006.01)

(52) U.S. Cl.
CPC .......... *H01L 28/10* (2013.01); *H01L 23/3157* (2013.01); *H01L 23/645* (2013.01)

(58) Field of Classification Search
CPC .... H01L 28/10; H01L 23/645; H01L 23/3157
See application file for complete search history.

(56) References Cited

U.S. PATENT DOCUMENTS

| | | |
|---|---|---|
| 2013/0328165 A1 | 12/2013 | Harburg et al. |
| 2016/0148926 A1 | 5/2016 | Lee et al. |
| 2017/0229532 A1 | 8/2017 | Chen et al. |
| 2017/0250134 A1* | 8/2017 | Sturcken ............. H01F 41/0206 |
| 2017/0290156 A1 | 10/2017 | Sturcken et al. |
| 2018/0204902 A1 | 7/2018 | Huang et al. |

(Continued)

FOREIGN PATENT DOCUMENTS

| | | |
|---|---|---|
| DE | 102018122563 A1 | 4/2019 |
| TW | 201709481 A | 3/2017 |

(Continued)

OTHER PUBLICATIONS

Lee et al., "Fabrication and Analysis of High-Performance Integrated Solenoid Inductor With Magnetic Core", IEEE Transactions on Magnetics, Nov. 2008, pp. 4089-4095, vol. 44, No. 11, IEEE.

(Continued)

*Primary Examiner* — Anthony Ho
(74) *Attorney, Agent, or Firm* — VIERING JENTSCHURA & PARTNER MBB (57) ABSTRACT

A semiconductor device may include: a substrate; a protective region provided over the substrate; and a core structure enclosed by the protective region. The core structure may include a core material etchable by a chemical solution. The protective region may include a protective material resistant to etching by the chemical solution. The core structure may have a first side and a second side opposite to the first side, the first side being closer to the substrate than the second side. The core structure may be narrowest at the first side of the core structure.

19 Claims, 8 Drawing Sheets

(56) References Cited

U.S. PATENT DOCUMENTS

2019/0103352 A1    4/2019   Chou

FOREIGN PATENT DOCUMENTS

TW         201740586 A    11/2017
TW         201840024 A    11/2018

OTHER PUBLICATIONS

Sturcken et al., "Magnetic Thin-Film Inductors for Monolithic Integration with CMOS", 2015 IEEE International Electron Devices Meeting (IEDM), 2015, 4 pages, IEEE.
Wang et al., "High-Q Magnetic Inductors for High Efficiency On-Chip Power Conversion", 2016 IEEE International Electron Devices Meeting (IEDM), 2016, 4 pages, IEEE.
Susai et al., "On-Chip Inductor Integration Scheme to Protect Thick Magnetic Core During Wet-etch Process", 2013, 17 pages, Globalfoundries Inc.
Examination report from parallel TW patent application 109131689 dated Nov. 16, 2021, 6 pages (for reference purposes only).
Examination report from parallel DE patent application 10 2020 123 974.2 dated Dec. 20, 2021, 10 pages (for reference purposes only).

* cited by examiner

SEMICONDUCTOR DEVICES AND METHODS OF FABRICATING A SEMICONDUCTOR DEVICE

TECHNICAL FIELD

The present disclosure relates generally to semiconductor devices and methods of fabricating a semiconductor device, in particular, inductor devices and methods of fabricating the inductor devices.

BACKGROUND

Inductor devices may include a magnetic core to enhance the magnetic fields generated by alternating current in the solenoids. It may be desirable to increase the thickness of the magnetic core to improve the efficiency of the inductor device. However, increasing the thickness of the magnetic core introduces various challenges to the fabrication process. Dry-etching of a thick magnetic core is generally impractical for thick magnetic cores due to high cost and very low throughput. On the other hand, wet-etching of a thick magnetic core may result in severe undercutting of the magnetic core such that the inductor performance is substantially reduced.

SUMMARY

According to various embodiments, there may be provided a semiconductor device. The semiconductor device may include: a substrate; a protective region provided over the substrate; and a core structure enclosed by the protective region. The core structure may include a core material etchable by a chemical solution. The protective region may include a protective material resistant to etching by the chemical solution. The core structure may have a first side and a second side opposite to the first side, the first side being closer to the substrate than the second side. The core structure may be narrowest at the first side of the core structure.

According to various embodiments, there may be provided a method of fabricating a semiconductor device. The method may include: forming a protective region over a substrate; and forming a core structure that includes a core material etchable by a chemical solution. The protective region may enclose the core structure. The protective region may include a protective material resistant to etching by the chemical solution. The core structure may have a first side and a second side opposite to the first side, wherein the first side may be closer to the substrate than the second side. The core structure may be narrowest at the first side.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Embodiments described below in context of the devices are analogously valid for the respective methods, and vice versa. Furthermore, it will be understood that the embodiments described below may be combined, for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

In order that the invention may be readily understood and put into practical effect, various embodiments will now be described by way of examples and not limitations, and with reference to the figures.

Figure 1:
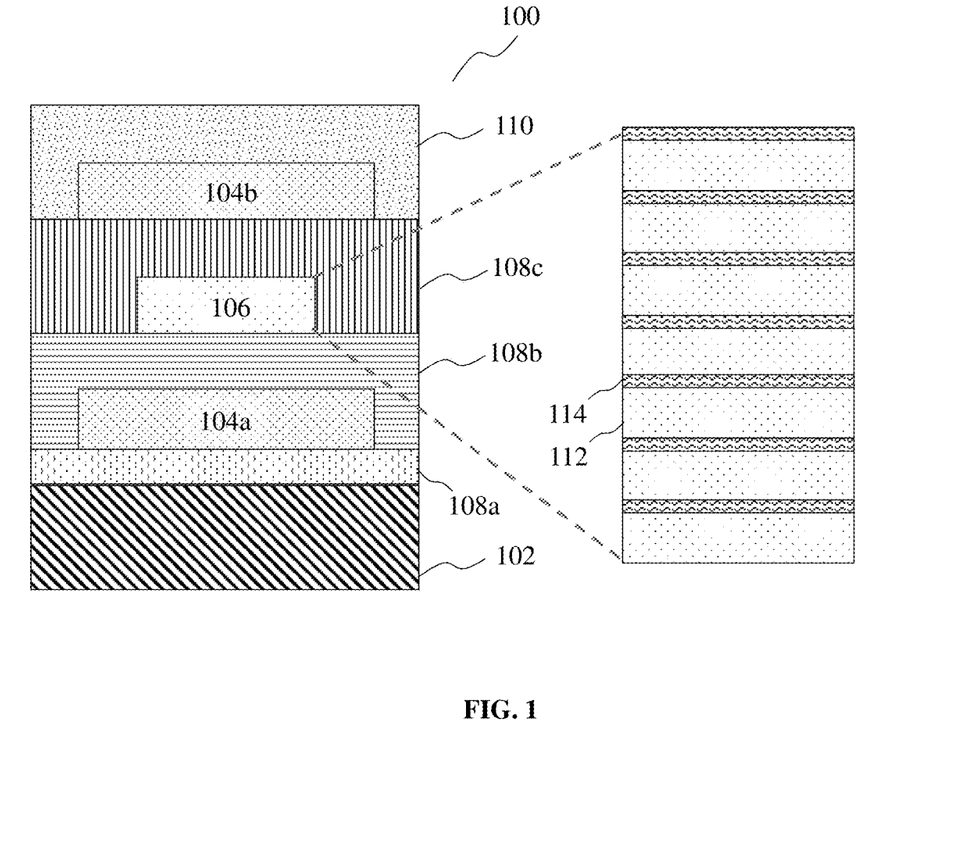
FIG. 1 shows an on-chip inductor device.

FIG. 1 shows an on-chip inductor device 100. The inductor 100 includes a silicon substrate 102, a first dielectric layer 108a over the silicon substrate 102, a second dielectric layer 108b arranged above the first electric layer 108a, a third dielectric layer 108c arranged above the second dielectric layer 108b, and a passivation layer 110 arranged above the second dielectric layer 108b. The second dielectric layer 108b encloses a first copper region 104a. The third dielectric layer encloses a magnetic film 106. The passivation layer 110 encloses a second copper region 104b. The magnetic film 106 includes alternating layers of magnetic material layer 112 and a dielectric laminating layer 114. Critical process steps in manufacturing the on-chip inductor device 100 includes plasma vapor deposition (PVD) of the magnetic material layer 112, and wet-etching of the magnetic material layer 112. The magnetic material layer 112 may be about 4 um in thickness and may include Cobalt Zyrconium Tantalum (CZT). The challenges in fabricating the on-chip inductor device 100 are described with respect to FIGS. 2 and 3.

Figure 2:
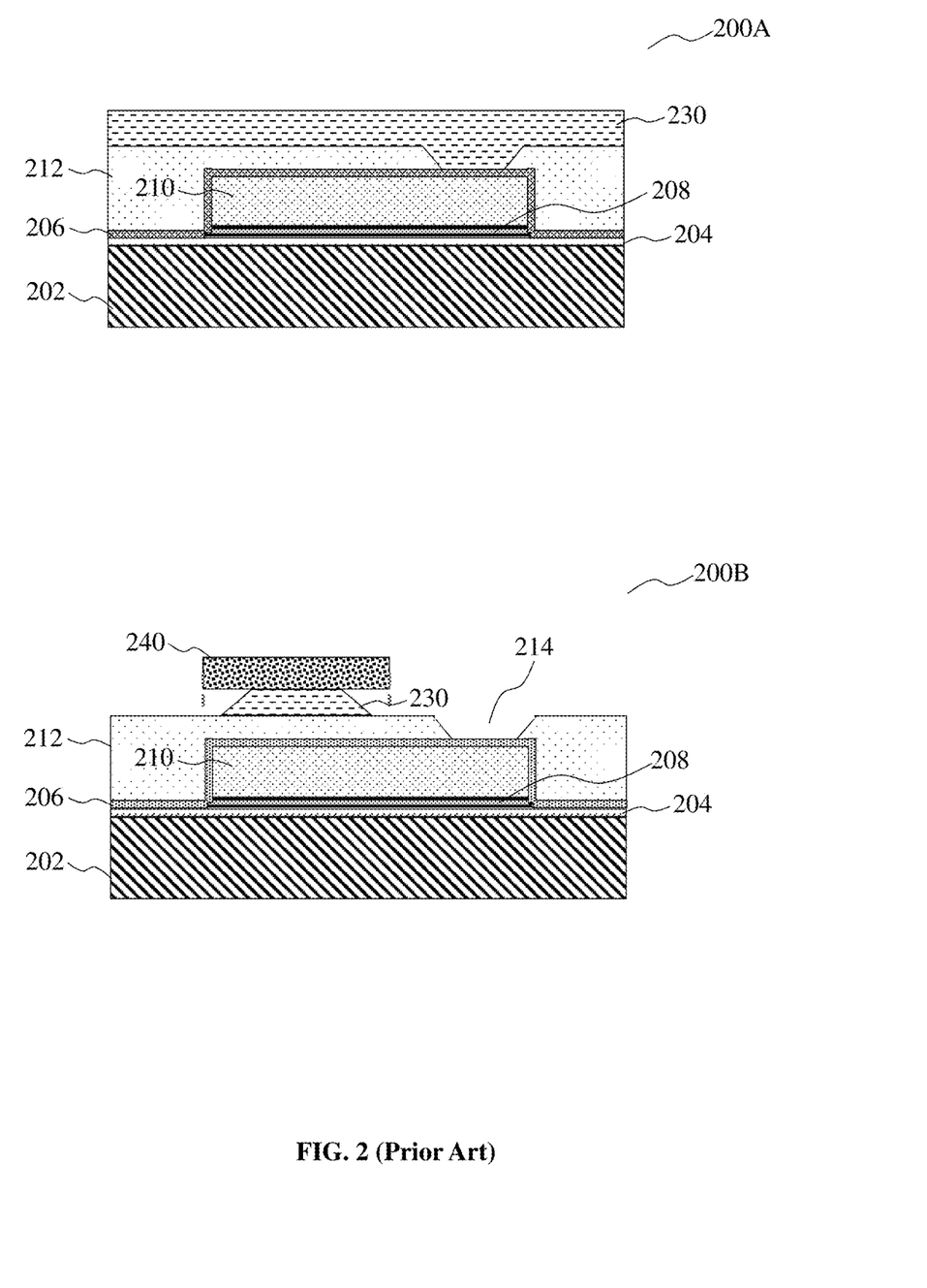
FIG. 2 shows cross-sectional views of processes that illustrate an existing method of fabricating an inductor device.

FIG. 2 shows cross-sectional views of processes 200A-200B that illustrate an existing method of fabricating the inductor device 100. Process 200A includes providing a base structure. The base structure includes a substrate 202, a tetraethoxysilane (TEOS) layer 204 arranged over the substrate 202, a seed layer 208 arranged over the TEOS layer 204, a copper plate 210 arranged over the seed layer 208, a silicon nitride (SiN) layer 206 arranged over the TEOS layer 204 and the copper plate 210, a polyimide (PI) film 212 arranged over the SiN layer 206, and a magnetic thick film 230 of 4 um thickness arranged over the PI film 212. Process 200B includes providing a photoresist mask 240 over the magnetic thick film 230 and wet-etching the magnetic thick film 230. Two critical steps of the inductor fabrication process are the physical vapor deposition (PVD) of the magnetic thick film 230, and the wet-etching of the magnetic thick film 230. During the PVD process, the magnetic thick film 230 may delaminate due to film stress and poor adhesion to the PI film 212. The wet-etching process etches sideways of the thick magnetic film 230, i.e. lateral etching. The lateral etching may cause premature lift-off of the photoresist mask 240 as the surface area of the magnetic film 230 that contacts the photoresist mask 240 shrinks. Residue or remaining un-etched magnetic film material may accumulate in the via 214. While the dielectric lamination layer 114 meets the required magnetic properties and provides good lamination, its properties in relation to lateral etching and etching rate makes it difficult to be used.

Figure 3:
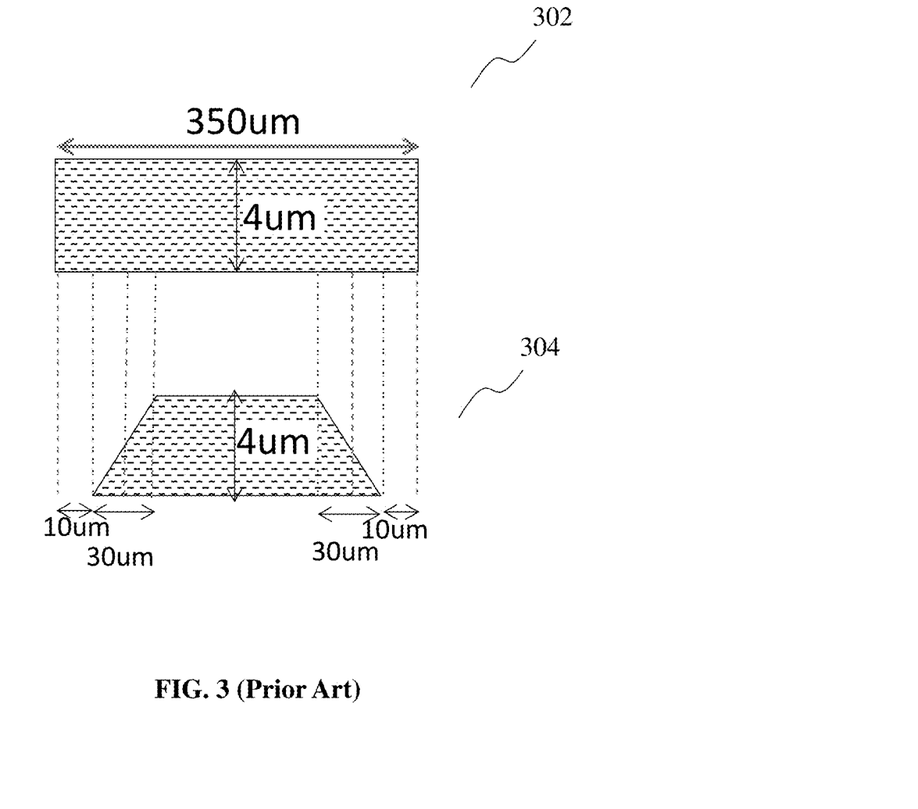
FIG. 3 shows a cross-section of a desired magnetic core as compared to the resultant magnetic core produced by the method shown in FIG. 2.

FIG. 3 shows a cross-section of a desired magnetic core 302, as compared to the resultant magnetic core 304 produced by the method shown in FIG. 2. The wet-etching process etches the magnetic core laterally, causing a sloped profile of about 30 um in the post-etch magnetic core. The thick magnetic film 230 is pulled back by about 10 um such that the resultant magnetic core loses about 20% of its intended width. The pull back and the tapered slope profile of the magnetic core are observed on all four sides of the rectangular magnetic core. In addition, the pyramid shaped slope profile of the magnetic core may be rough as a result of the wet-etch. The reduction in the magnetic core and the rough surface of the slope profile degrade the magnetic property of the magnetic core and affect the reliability of the inductor device. As a result, the inductance of the inductor device may be about 20% less than the intended value.

FIGS. 4A-4F are simplified cross-sectional views of a semiconductor device according to various non-limiting embodiments, at various stages of fabrication. These cross-sectional views may be simplified views that only show part of the semiconductor device. The semiconductor device may be an inductor device. The inductor device may be an on-chip inductor. The inductor device may include electrical conductor regions that surround a magnetic core. The electrical conductor regions may generate a magnetic field as an electrical current passes through the electrical conductor regions. The magnetic core may enhance the strength of the magnetic field.

Figure 4A:
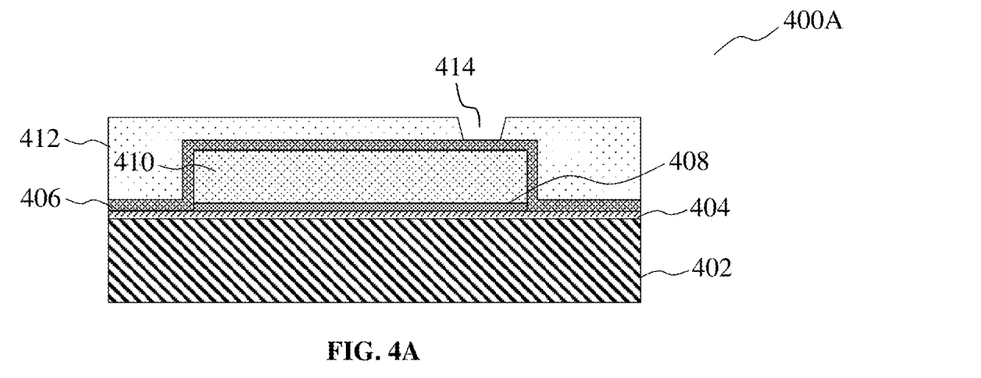
FIGS. 4A-4F are simplified cross-sectional views of a semiconductor device according to various non-limiting embodiments, at various stages of fabrication.

FIG. 4A shows a process 400A in a method of fabricating the semiconductor device according to various non-limiting embodiments. The process 400A may include providing a starting structure that may include a substrate 402, an electrical conductor region 410, and a first protective region 412. The substrate 402 may include a semiconductor, such as silicon. The electrical conductor region 410 may be provided above the substrate 402. The electrical conductor region may include a metal, such as but not limited to, copper, titanium, silver, gold, alloys thereof, or combinations thereof. There may be an insulator layer 404 between the substrate 402 and the electrical conductor region 410. The insulator layer 404 may include an electrically insulating material or a dielectric material, such as tetraethoxysilane (TEOS) or silicon dioxide. A seed layer 408 may be provided over the insulator layer 404, for forming the electrical conductor region 410 thereon. The seed layer 408 may therefore be arranged between the electrical conductor region 410 and the insulator layer 404. A barrier region 406 may be arranged to enclose the electrical conductor region 410. The barrier region 406 may also overlay regions of the insulator layer 404 that do not lie directly under the electrical conductor region 410. The barrier region 406 may serve as an etch mask that protects the electrical conductor region 410 from being etched. The barrier region 406 may include silicon nitride. The first protective region 412 may be provided over the barrier region 406. The first protective region 412 may cover an entire top surface of the barrier region 406, except for an opening 414. The top surface of the barrier region 406 may be opposite to a bottom surface of the barrier region 406 that may be in direct contact with the electrical conduction region 410. The first protective region 412 may include a protective material that may be resistant to etching by a chemical solution, i.e. etchant that may be used subsequently to etch a core material. The protective material may be susceptible to being etched by dry etching, or by wet-etching using a different etchant from the etchant that may be used to etch the core material. The protective material may be a light-sensitive material so that it may be etched by lithography. The protective material may be photo-sensitive polyimide (PSPI). The first protective region 412 may be formed by coating the barrier region 406 with PSPI solution, exposing the PSPI solution to form a PSPI film, and then curing the PSPI film. The PSPI film may be patterned using a first mask in a first via layer.

Figure 4B:
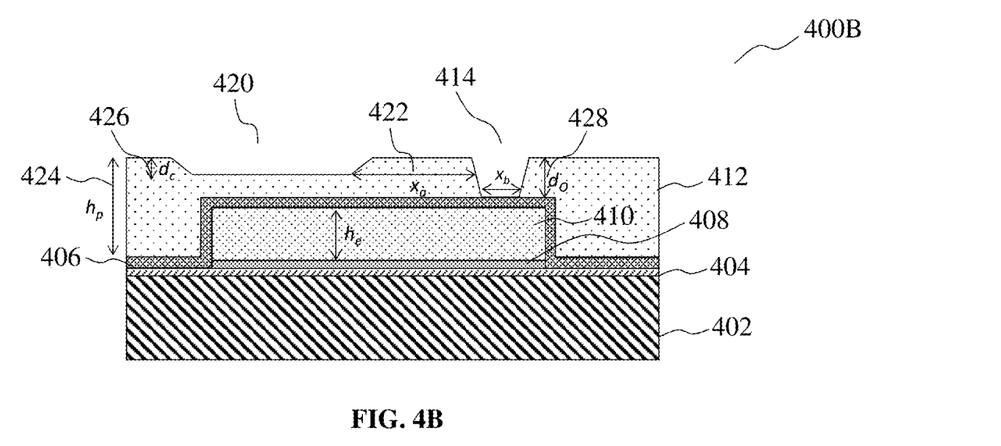

FIG. 4B shows a process 400B in a method of fabricating the semiconductor device according to various non-limiting embodiments. The process 400B may include forming a cavity 420 in the first protective region 412. The cavity 420, herein also referred to as a "bath tub", may protect the side walls of a core structure of the semiconductor device, during a subsequent wet-etching process. The cavity 420 may be formed in the first protective region 412 by etching the first protective region 412 using a mask, for example by lithography. The process 400B may include depositing more protective material to increase a height $h_p$ 424 of the first protective region 412 before forming the cavity 420. The added protective material may be PSPI. The process 400B may include coating the first protective region 412 with PSPI solution, exposing the PSPI solution to form a PSPI film, and then curing the PSPI film, to increase the height $h_p$ 424 of the first protective region 412. The process 400B may include patterning the PSPI film with a second mask in a second via layer. The cavity 420 may be formed in the first protective region 412 such that the cavity 420 appears to be carved out of the first protective region 412. The opening of the cavity 420 may be at a same height, i.e. position along a vertical axis, as the top surface of most of the rest of the first protective region 412. The base of the cavity 420 may be at a lower height than the rest of the top surface of the first protective region 412. The top surface may be opposite to a bottom surface of the first protective region 412 that may be in contact with the barrier region 406. The side walls of the cavity 420 may be slanted outwards, in other words, sloped such that the base of the cavity 420 is narrower than the opening of the cavity 420. The sloping of the side walls of the cavity 420 may be caused by isotropic etching of the first protective region 412. As an example, the height $h_e$ of the electrical conductor region 410 may be about 15 um, the height $h_p$ 424 of the first protective region 412 may be about 25 um, the depth $d_c$ 426 of the cavity 420 may be about 5 um and the depth $d_O$ 428 of the opening 414 may be about 10 um. In the same example, a distance $x_a$ 422 between the cavity 420 and the opening 414 may be about 27 um. The width $x_b$ of the opening may be about 50 um. The height $h_p$ 424 of the first protective region 412 may be generally uniform, except at the cavity 420 and at the opening 414. The height $h_p$ 424 may be reduced at the cavity 420 and at the opening 414, as compared to the rest of the first protective region 412. The depth 426 of the cavity 420 may be at least substantially equal to a desired depth of the core structure. The core structure may be the magnetic core of an inductor device.

Figure 4C:
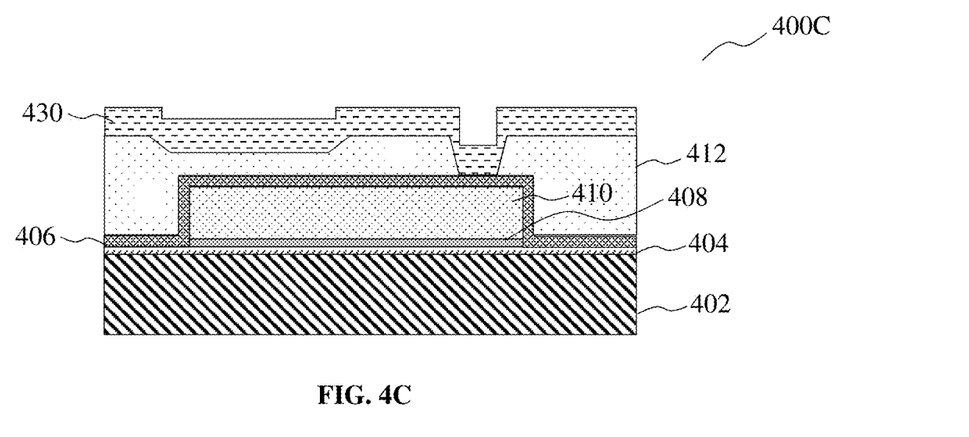

FIG. 4C shows a process 400C in a method of fabricating the semiconductor device according to various non-limiting embodiments. The process 400C may include providing a layer of core material 430 over the first protective region 412. The core material 430 may include a magnetic material, for example, Cobalt Zyrconium Tantalum (CZT), Cobalt Zyrconium Tantalum Boron (CZTB), Iron Cobalt Boron (FeCoB), Nickel Iron (NiFe) etc. The core material 430 may be provided by physical vapor deposition (PVD) to create a thin film of the core material 430. The thin film may adhere to the underlying first protective region 412, and thereby fill out the cavity 420 and the opening 414. The layer of core material 430 may conform to the shape of the first protective region 412 that lies underneath the core material 430. The core material 430 may include alternating layers of magnetic material layer and a dielectric laminating layer. The dielectric lamination layer may include any one of AlN, CoO, SiO2, Al2O3 or combinations thereof.

Figure 4D:
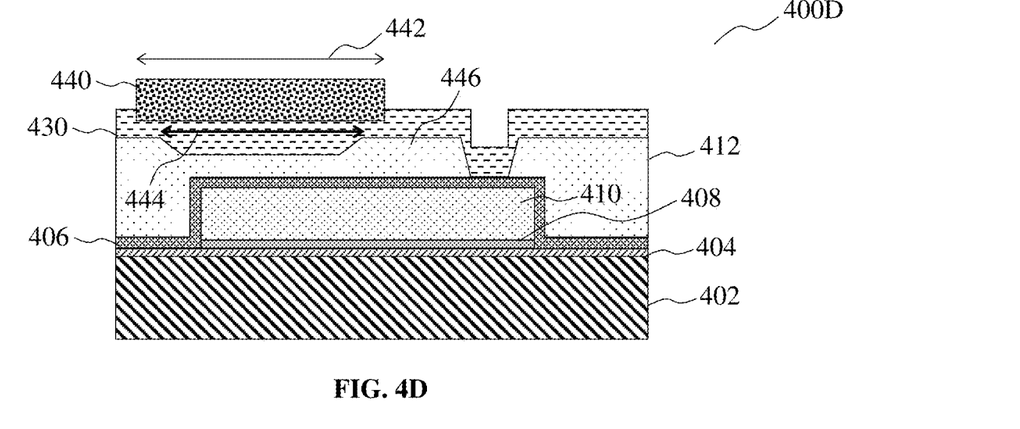

FIG. 4D shows a process 400D in a method of fabricating the semiconductor device according to various non-limiting embodiments. The process 400D may include forming a wet etch mask 440. Forming the wet etch mask 440 may include patterning a light sensitive material, e.g. photoresist, over the core material 430, using a third mask in a magnetic core layer. First, the photoresist may be applied as a coating over the core material 430. Next, a developer solution may be applied to the photoresist, before the photoresist is exposed to light while being partially shaded from the light by a patterned mask. The developer solution may dissolve away either the regions of the photoresist that was exposed to light or not exposed to light, depending on whether a positive or a negative resist is used. The remaining photoresist may be the wet etch mask 440. The wet etch mask 440 may be at least substantially aligned with the cavity 420, in other words, the wet etch mask 440 may overlap with a region of the core material 430 that fills out the cavity 420. The wet etch mask 440 may at least partially overlap with raised edges 446 of the cavity. The width 442 of the wet etch mask 440 may be wider, or at least equal to, the width 444 of the cavity 420. The cross-sectional area of the wet etch mask 440 may be larger than the cross-sectional area of the opening of the cavity 420.

Figure 4E:
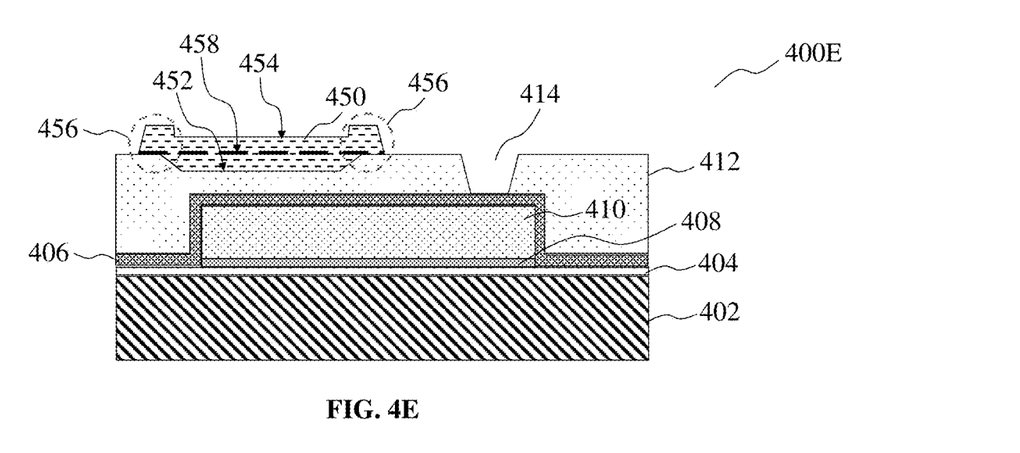

FIG. 4E shows a process 400E in a method of fabricating the semiconductor device according to various non-limiting embodiments. The process 400E may include forming the core structure 450. Forming the core structure 450 may include etching the core material 430 using a chemical solution, i.e. by wet etching. The chemical solution may be sprayed on the core material 430. Regions of the core material that are not obscured by the wet etch mask 440 may be removed by the chemical solution. The core material that remain behind after the wet etching may be referred herein as the core structure 450. As the wet-etching process may be isotropic, the sidewalls of the core structure may not be vertical. The core material 430 may be patterned by wet-etching instead of dry etching as wet-etching is more effective for etching thick materials. Wet-etching may remove thick materials at a lower cost and at a higher throughput than dry etching. The thickness of the core structure 450 may be at least 3 um, for example, in a range of about 4 um to about 6 um. The opening 414 may be exposed again, after the core material 430 in it has been removed. The final shape of the core structure 450 may be formed after the process 400E. The core structure 450 may be partially received in the cavity 420, and partially protruding out of the cavity 420. A bottom surface of the core structure 450 that lies within the cavity 420, in direct contact with the first protective region 412, may be referred to as the first side 452 of the core structure 450. A top surface of the core structure 450, which is opposite to the first side 452, may be referred herein as the second side 454 of the core structure 450. Each of the first side 452 and the second side 454 may be at least substantially planar. The first side 452 and the second side 454 may be at least substantially parallel to one another. The thickness of the core structure 450 may be referred to as the distance between the first side 452 and the second side 454. As the wet etch mask 440 was larger than the cavity 420, the second side 454 may be wider than the first side 452. Further, as the side walls of the cavity 420 tapers from the opening of the cavity 420 to the base of the cavity 420, the first side 452 may be the narrowest part of the core structure 450 owing to the shape of the cavity 420. The widest plane 458 in the core structure 450 may be a cross-section of the core structure 450 at a height where the first protective region 412 ends. The size of the widest plane 458 may at least substantially correspond to the width of the wet-etch mask 440. The widest plane 458 may taper from its periphery, towards the second side 454, as a result of pull-back of the core material 430 during the etching of the core material 430. The widest plane 458 may taper from an inner region at a distance away from its periphery, towards the first side 452. The size of the inner region may at least substantially correspond to the size of the opening of the cavity 420. The core structure 450 may include protrusions 456, also referred herein as wing structures. Each protrusion 456 may be a region of the core structure 450 that extends laterally out of the opening of the cavity 420. The core structure 450 may include an indentation between the protrusions 456.

Figure 4F:
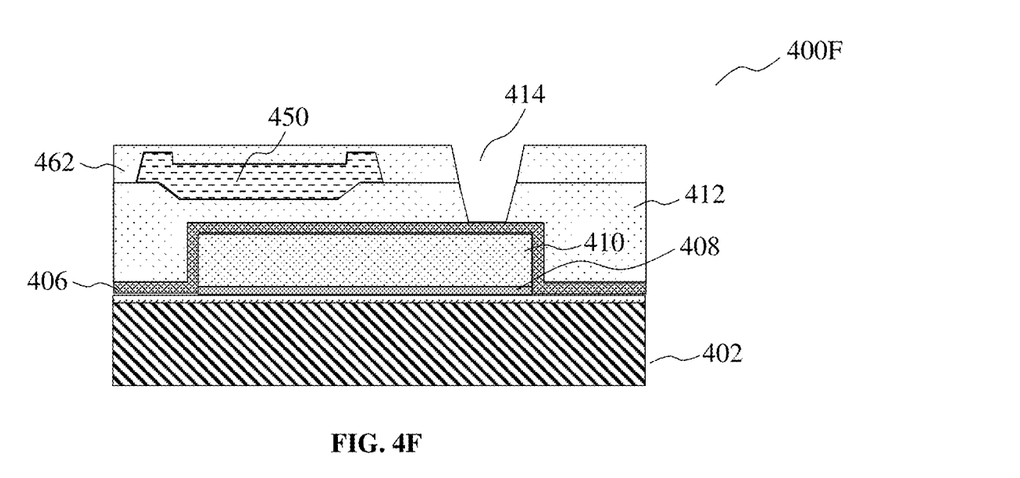

FIG. 4F shows a process 400F in a method of fabricating the semiconductor device according to various non-limiting embodiments. The process 400F may include forming a second protective region 462. The second protective region 462 may cap the core structure 450, and may also overlay the first protective region 412. The second protective region 462 may be identical in composition, to the first protective region 412, such that the second protective region 462 and the first protective region 412 may be indistinguishable. The first protective region 412 and the second protective region 462 may be collectively referred to, as the protective region of the semiconductor device. Forming the second protective region 462 may include depositing protective material over the core structure 450 and the first protective region 412, then etching the newly deposited protective material to reveal the opening 414, using a mask in the first via layer. The process of forming the second protective region 462 may be similar to the process of forming the first protective region 412.

FIGS. 5A-5F are simplified cross-sectional views of a semiconductor device according to various embodiments, at various stages of fabrication. These cross-sectional views may be simplified views that only show part of the semiconductor device.

Figure 5A:
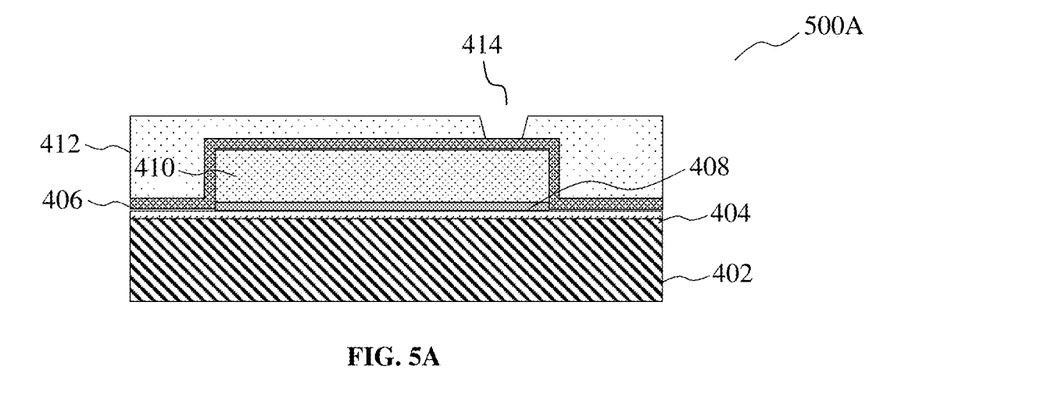
FIGS. 5A-5F are simplified cross-sectional views of a semiconductor device according to various embodiments, at various stages of fabrication.

FIG. 5A shows a process 500A in a method of fabricating the semiconductor device according to various non-limiting embodiments. The process 500A may be identical to the process 400A.

Figure 5B:
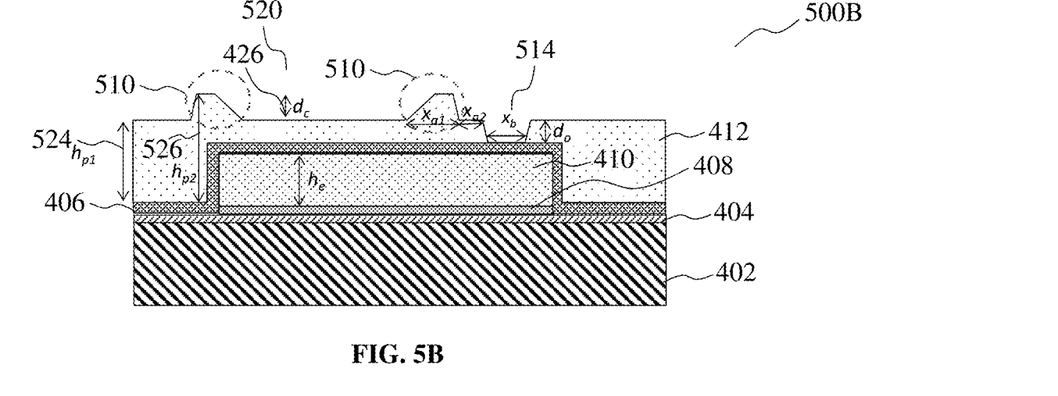

FIG. 5B shows a process 500B in a method of fabricating the semiconductor device according to various non-limiting embodiments. The process 500B may include forming a cavity 520 in the first protective region 412. Unlike the cavity 420 which may be depressed into the first protective region 412, the base of the cavity 520 may be at least substantially at a same height as the top surface of the first protective region 412. The opening of the cavity 520 may be at a higher position than the top surface of most of the rest of the first protective region 412. The cavity 520 may be formed by ring-fencing a portion of the top surface with raised edge 510. The process 500B may include forming the raised edge 510 to surround a portion of the top surface. The surrounded portion may form the cavity 520. Like in the process 400B, the process 500B may include depositing more protective material to increase a height of the first protective region 412 from for example, $h_{p1}$ 524 to $h_{p2}$ 526, and then etching the added protective material to form the raised edge 510. The side walls of the cavity 520 may be slanted outwards, in other words, sloped such that the base of the cavity 520 is narrower than the opening of the cavity 520. The sloping of the side walls of the cavity 520 may be caused by isotropic etching of the first protective region 412. As an example, the height $h_e$ of the electrical conductor region 410 may be about 15 um, the height $h_{p1}$ 524 may be about 20 um, the height $h_{p2}$ may be about 25 um, the depth $d_c$ 426 of the cavity 520 may be about 5 um and the depth of the opening $d_O$ may be about 10 um. The raised edge 510 may have a thickness of about 5um. In the same example, a width $x_{a1}$ of the raised edge 510 at the base may be about 15 um. A distance $x_{a2}$ from the base of the raised edge 510 to the opening 514 may be about 12 um. The width $x_b$ of the opening 514 may be about 50 um. The thickness 424 of the first protective region 412 may be generally uniform, except at the raised edge 510 and at the opening 414. The thickness 424 may be larger at the raised edge 510, and may be lower at the opening 414, as compared to the rest of the first protective region 412. The depth 426 of the cavity 420 may be at least substantially equal to a desired depth of the core structure. The core structure may be the magnetic core of an inductor device.

Figure 5C:
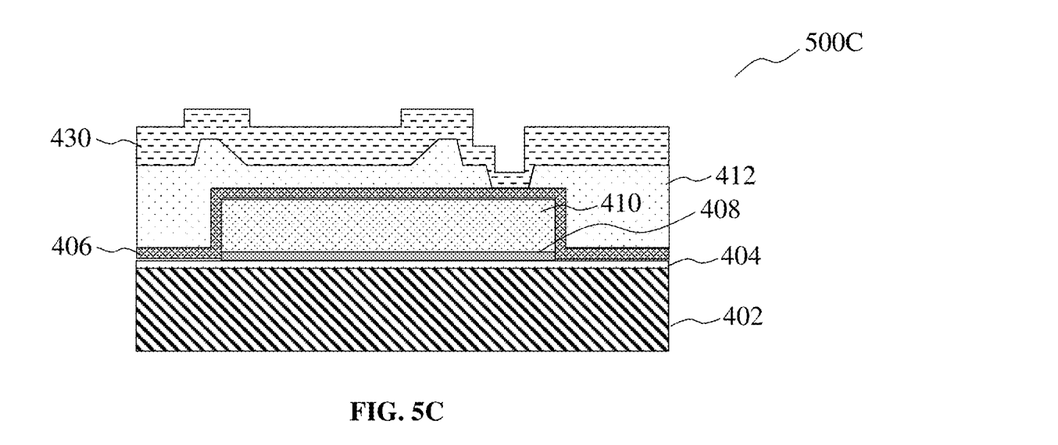

FIG. 5C shows a process 500C in a method of fabricating the semiconductor device according to various non-limiting embodiments. The process 500C may be identical to, or at least similar to the process 400C. The process 500C may include providing a layer of core material 430 over the first protective region 412, identical to, or at least similar to the process 400C. The core material 430 may be provided by PVD to create a thin film that may adhere to the underlying first protective region 412, and thereby fill out the cavity 520 and the opening 414. The layer of core material 430 may conform to the shape of the first protective region 412 that lies underneath the core material 430.

Figure 5D:
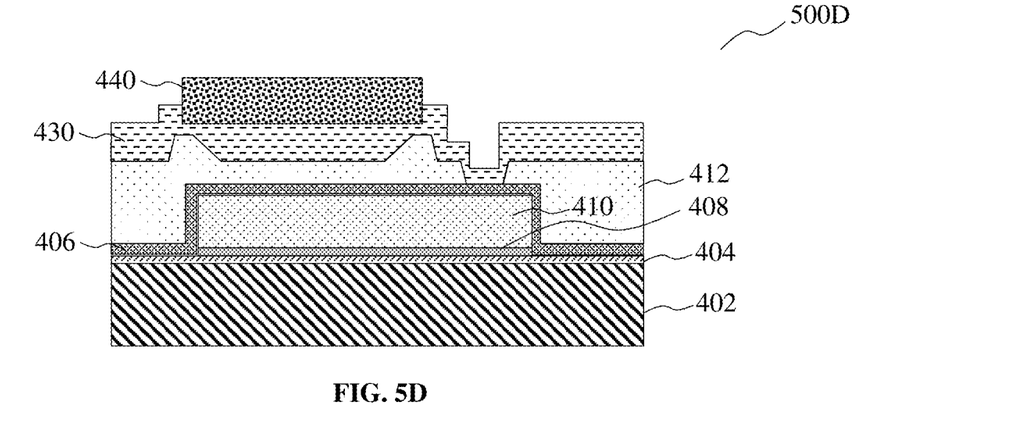

FIG. 5D shows a process 500D in a method of fabricating the semiconductor device according to various non-limiting embodiments. The process 500D may be identical to, or at least similar to the process 400D. The process 500D may include forming a wet etch mask 440. The wet etch mask 440 may be at least substantially aligned with the cavity 520, in other words, the wet etch mask 440 may overlap with a region of the core material 430 that fills out the cavity 520. The wet etch mask 440 may at least partially overlap with the raised edge 510. The width 442 of the wet etch mask 440 may be wider, or at least equal to, the width 444 of the cavity 420. The cross-sectional area of the wet etch mask 440 may be larger than the cross-sectional area of the opening of the cavity 420.

Figure 5E:
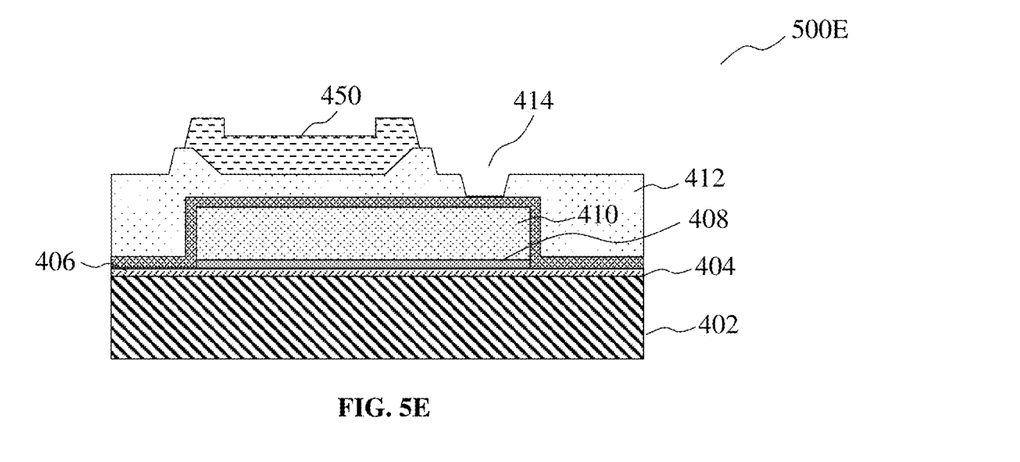

FIG. 5E shows a process 500E in a method of fabricating the semiconductor device according to various non-limiting embodiments. The process 500E may be identical to, or at least similar to the process 400E. The process 500E may include forming the core structure 450, by wet-etching the core material 430 using a chemical solution. Regions of the core material that are not obscured by the wet etch mask 440 may be removed by the chemical solution. The core material that remain behind after the wet etching may be referred herein as the core structure 450. The side walls of the core structure 450 may be protected from being etched, by the raised edge 510 as the protective material may be resistant to etching by the chemical solution.

Figure 5F:
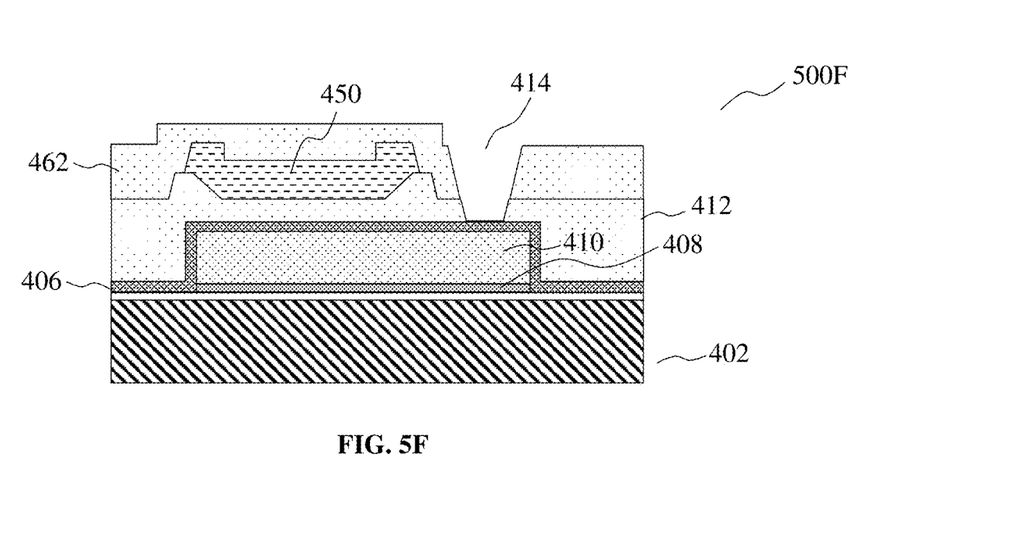

FIG. 5F shows a process 500F in a method of fabricating the semiconductor device according to various non-limiting embodiments. The process 500F may be identical to, or at least similar to the process 400F. The process 500F may include forming a second protective region 462. The second protective region 462 may cap the core structure 450, and may also overlay the first protective region 412. The second protective region 462 may be identical in composition, to the first protective region 412, such that the second protective region 462 and the first protective region 412 may be indistinguishable. The first protective region 412 and the second protective region 462 may be collectively referred to, as the protective region of the semiconductor device.

According to various non-limiting embodiments, the methods described with respect to FIGS. 4A-4F and 5A-5F may also be used to form other types of semiconductor devices, other than inductors. The methods described may be applicable to other fabrication processes that involve wet-etching, where there is a need to protect a core structure from lateral etching.

According to various non-limiting embodiments, the methods described above may improve the adhesion of the core structure to the protective region, since the core structure retains a large surface area of contact with the protective region. In contrast, in prior arts, the core structure may be pulled back such that the surface area of contact with the protective region is reduced and the side wall roughness found in the magnetic core material post-etching would cause reliability degradation of the inductor performance.

According to various non-limiting embodiments, the methods described above may provide various advantages. The method may allow thick core structures, for example 4 um to 7 um to be fabricated. In the context of an inductor device where the core structure may be a magnetic core, the thick magnetic core may widen the window for performance tuning of the inductor device. Etching of thick structures may be better using wet-etching processes rather than dry-etching, for lower cost and higher throughput. Wet-etching results in zero pull back of the core structure in the described methods, as the side walls of the core structure are shielded from the etchant, i.e. the chemical solution, by the protective region. The side walls of the core structure may also be smooth due to its lack of contact with the etchant. In the context of a core structure that is the magnetic core of an inductor device, rough side walls may be detrimental to the magnetic performance of the magnetic core. With the side walls of the core structure shielded from any etchants by the protective region, the semiconductor device may be subjected to aggressive wet-etching to cleanly remove unnecessary regions of the core material, including any residue that may be trapped in the opening 414. Also, as lateral etching may be prevented, any dielectric layer which has superior magnetic performance but is susceptible to lateral etching, may still be used as the dielectric lamination layer.

Figure 6:
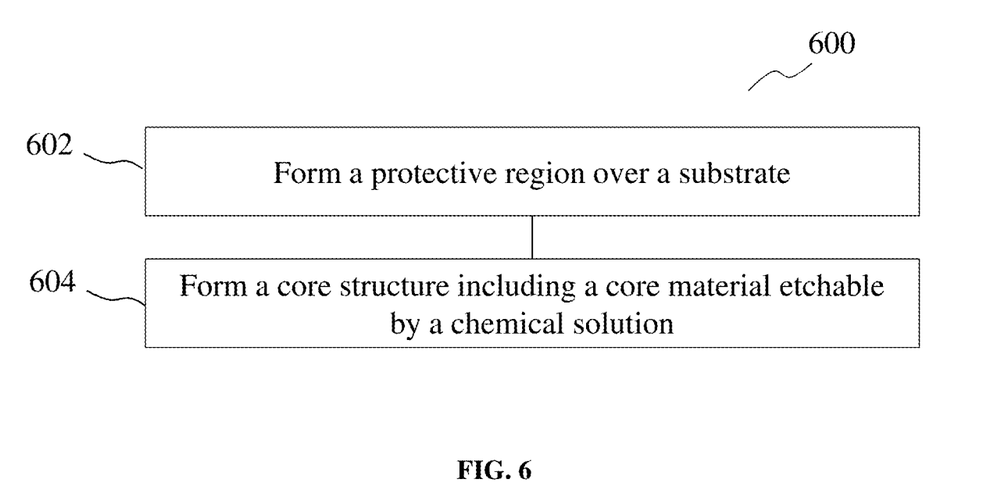
FIG. 6 shows a flow diagram of a method of fabricating a semiconductor device according to various non-limiting embodiments.

FIG. 6 shows a flow diagram 600 of a method of fabricating a semiconductor device according to various non-limiting embodiments. The method may include forming a protective region over a substrate, in 602. The method may include forming a core structure, in 604. The core structure may include a core material etchable by a chemical solution, i.e. the etchant. The core structure may consist of only the core material. The protective region may enclose the core structure. The protective region may include a protective material that may be resistant to etching by the chemical solution. The protective region may consist of only the protective material. The core structure may have a first side and a second side opposite to the first side. The first side may be closer to the substrate than the second side. The core structure may be narrowest at the first side.

The method shown in FIG. 6 may include the methods described with respect to FIGS. 4A-4F and 5A-5F. In other words, the protective region described with respect to FIG. 6 may include the first protective region 412 and the second protective region 462. The substrate described with respect to FIG. 6 may be the substrate 402. The core structure described with respect to FIG. 6 may be the core structure 450. The core material described with respect to FIG. 6 may be the core material 430. 610 may include forming a first layer of the protective region over the substrate before forming the core structure, and forming a second layer of the protective region over the core structure and the first layer after forming the core structure. The first layer may include a cavity for receiving the core structure. The first layer may be the first protective region 412. The cavity may be the cavity 420 or 520. The second layer may be the second protective region 462. 604 may include depositing the core material over the first layer and into the cavity. 604 may further include patterning an etch mask over the core material and etching the core material using the chemical solution. The etch mask may be the wet etch mask 440. The etch mask may be wider than the cavity. The first layer may protect side walls of the core structure from being laterally etched by the chemical solution during the etching of the core material.

According to various non-limiting embodiments, the semiconductor device may be an inductor device. The core structure 450 may be a magnetic thin film material. The core structure may include any one of CZT, CZTB, FeCoB, NiFe, or combinations thereof. The protective region may include PSPI. The semiconductor device may further include an electrical conductor region between the substrate and the protective region. The electrical conductor region may be the electrical conductor region 410. The electrical conductor region may be arranged at least partially under the core structure.

According to various non-limiting embodiments, the core structure 450 may have a thickness (in other words: a distance between the first side and the second side) of at least 3 um, for example 4 um to 6 um. Each of the first side and the second side may be at least substantially planar and may be at least substantially parallel to each other. The core structure may be widest at a plane between the first side and the second side. The plane may be equidistant from the first side and the second side. The plane may taper towards the second side from a periphery of the plane, and may taper towards the first side at a distance from the periphery, i.e. from an inner region of the plane.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various non-limiting embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A semiconductor device comprising:
   a substrate;
   a protective region provided over the substrate, the protective region comprising a protective material resistant to etching by a chemical solution; and
   a core structure enclosed by the protective region, the core structure comprising a core material etchable by the chemical solutions
   wherein the core structure has a first side and a second side opposite to the first side, the first side being closer to the substrate than the second side, and the core structure being narrowest at the first side of the core structure, and
   wherein the core structure is widest at a plane between the first side and the second side.

2. The semiconductor device of claim 1, wherein the core structure is a magnet.

3. The semiconductor device of claim 1, wherein the core material comprises at least one of Cobalt Zyrconium Tantalum, Cobalt Zyrconium Tantalum Boron, Iron Cobalt Boron and Nickel Iron.

4. The semiconductor device of claim 1, wherein a distance between the first side and the second side is at least 3 um.

5. The semiconductor device of claim 1, wherein the protective material comprises photo-sensitive polyimide.

6. The semiconductor device of claim 1, wherein each of the first side and the second side are at least substantially planar and at least substantially parallel to each other.

7. The semiconductor device of claim 1, wherein the widest plane tapers towards the second side from a periphery of the widest plane, and wherein the widest plane tapers towards the first side at a distance from the periphery.

8. The semiconductor device of claim 1, further comprising:
   an electrical conductor region between the substrate and the protective region;
   wherein the electrical conductor region is arranged at least partially under the core structure.

9. The semiconductor device of claim 1, wherein the semiconductor device is an inductor, wherein the core structure is a magnet.

10. A method of fabricating a semiconductor device, the method comprising:
    forming a protective region over a substrate, the protective region comprising a protective material resistant to etching by a chemical solution; and
    forming a core structure enclosed by the protective region, the core structure comprising a core material etchable by the chemical solution;
    wherein the core structure has a first side and a second side opposite to the first side, the first side being closer to the substrate than the second side, and the core structure being narrowest at the first side; and
    wherein the core structure is widest at a plane between the first side and the second side.

11. The method of claim 10, wherein forming the protective region comprises:
    forming a first layer of the protective region over the substrate, the first layer comprising a cavity for receiving the core structure, before forming the core structure; and
    forming a second layer of the protective region over the core structure and the first layer, after forming the core structure.

12. The method of claim 11, wherein forming the core structure comprises:
    depositing the core material over the first layer and into the cavity;
    patterning an etch mask over the core material; and
    etching the core material using the chemical solution.

13. The method of claim 12, wherein the first layer of the protective region protects side walls of the core structure from being laterally etched by the chemical solution during the etching of the core material.

14. The method of claim 12, wherein the etch mask is wider than the cavity.

15. The method of claim 10, wherein the widest plane tapers towards the second side from a periphery of the widest plane, and wherein the widest plane tapers towards the first side at a distance from the periphery.

16. The method of claim 10, wherein the core material comprises at least one of Cobalt Zyrconium Tantalum, Cobalt Zyrconium Tantalum Boron, Iron Cobalt Boron and Nickel Iron.

17. The method of claim 10, wherein a distance between the first side and the second side is at least 3 um.

18. The method of claim 10, wherein the protective material comprises photo-sensitive polyimide.

19. The method of claim 10, further comprising:
    providing an electrical conductor region between the substrate and the protective region, wherein the electrical conductor region is arranged at least partially under the core structure.

* * * * *